(12) United States Patent
Kim et al.

(10) Patent No.: US 11,183,496 B2
(45) Date of Patent: Nov. 23, 2021

(54) SEMICONDUCTOR DEVICE

(71) Applicant: SAMSUNG ELECTRONICS CO., LTD., Suwon-si (KR)

(72) Inventors: Ju-Youn Kim, Suwon-si (KR); Hyun-Jo Kim, Seoul (KR); Hwa-Sung Rhee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 19 days.

(21) Appl. No.: 16/366,140

(22) Filed: Mar. 27, 2019

(65) Prior Publication Data

US 2019/0221564 A1 Jul. 18, 2019

Related U.S. Application Data

(63) Continuation of application No. 15/014,291, filed on Feb. 3, 2016, now Pat. No. 10,276,567.

(30) Foreign Application Priority Data

Jun. 22, 2015 (KR) .................... 10-2015-0088208

(51) Int. Cl.
*H01L 27/088* (2006.01)
*H01L 27/02* (2006.01)
*H01L 29/06* (2006.01)
*H01L 29/66* (2006.01)
*H01L 29/78* (2006.01)

(52) U.S. Cl.
CPC ...... *H01L 27/0886* (2013.01); *H01L 27/0207* (2013.01); *H01L 29/0649* (2013.01); *H01L 29/66795* (2013.01); *H01L 29/785* (2013.01); *H01L 29/7856* (2013.01)

(58) Field of Classification Search
CPC ............. H01L 27/0207; H01L 27/0886; H01L 29/0649; H01L 29/66795; H01L 29/785; H01L 29/7856
USPC ........................................ 257/401–405, 416
See application file for complete search history.

(56) References Cited

U.S. PATENT DOCUMENTS

| 7,098,502 B2 | 8/2006 | Mathew et al. |
| 8,541,274 B1 | 9/2013 | Xie et al. |
| 8,697,523 B2 | 4/2014 | Cai et al. |
| 8,803,254 B2 | 8/2014 | Laloe et al. |

(Continued)

FOREIGN PATENT DOCUMENTS

| JP | 2011/009296 A | 1/2011 |
| KR | 10-2005-0025197 A | 3/2005 |

(Continued)

*Primary Examiner* — Meiya Li
(74) *Attorney, Agent, or Firm* — Lee IP Law, P.C.

(57) ABSTRACT

Semiconductor devices are provided. The semiconductor device includes an active fin which extends along a first direction and has a protruding shape, a gate structure which is disposed on the active fin to extend along a second direction intersecting the first direction, and a spacer which is disposed on at least one side of the gate structure, wherein the gate structure includes a first area and a second area which is adjacent to the first area in the second direction, wherein a first width of the first area in the first direction is different from a second width of the second area in the first direction, and the spacer extends continuously along both the first area and the second area.

20 Claims, 14 Drawing Sheets

(56) References Cited

U.S. PATENT DOCUMENTS

| | | |
|---|---|---|
| 8,809,178 B2 | 8/2014 | Liu et al. |
| 8,823,101 B2 | 9/2014 | Ohguro |
| 8,846,477 B2 | 9/2014 | Cai et al. |
| 2011/0159686 A1* | 6/2011 | Jung .................. G03F 7/0035 438/671 |
| 2014/0015059 A1 | 1/2014 | Kouda et al. |
| 2014/0077303 A1 | 3/2014 | Baek |
| 2014/0183599 A1 | 7/2014 | Hong et al. |
| 2014/0252496 A1 | 9/2014 | Liu et al. |
| 2015/0137262 A1 | 5/2015 | Baek et al. |
| 2015/0214325 A1* | 7/2015 | Anderson ......... H01L 29/66545 257/288 |

FOREIGN PATENT DOCUMENTS

| | | |
|---|---|---|
| KR | 10-2008-0074573 A | 8/2008 |
| WO | WO 2010/150429 A1 | 12/2010 |

\* cited by examiner

1200

1300

1400

SEMICONDUCTOR DEVICE

CROSS-REFERENCE TO RELATED APPLICATIONS

This is a continuation application based on pending application Ser. No. 15/014,291, filed Feb. 3, 2016, the entire contents of which is hereby incorporated by reference.

This application claims priority from Korean Patent Application No. 10-2015-0088208, filed on Jun. 22, 2015, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device.

2. Description of the Related Art

Semiconductor devices are being developed to operate at a high speed with low voltages. In addition, a process of fabricating a semiconductor device is being developed to increase integration density.

Increased integration density can cause a short channel effect in a field effect transistor which is a type of a semiconductor device. To overcome this problem, research is being actively conducted on a fin field effect transistor (FinFET) which includes a channel having a three-dimensional spatial structure.

SUMMARY

Aspects of the present disclosure provide a semiconductor device with improved reliability.

Aspects of the present disclosure also provide a semiconductor device with improved reliability by varying a width of a gate structure according to area.

According to an aspect of the present disclosure, there is provided a semiconductor device including an active fin which extends along a first direction and has a protruding shape, a gate structure which is disposed on the active fin to extend along a second direction intersecting the first direction and a spacer which is disposed on at least one side of the gate structure, wherein the gate structure includes a first area and a second area which is adjacent to the first area in the second direction, wherein a first width of the first area in the first direction is different from a second width of the second area in the first direction, and the spacer extends continuously along both the first area and the second area.

In some example embodiments, the second area is disposed on the active fin, and the first area is not disposed on the active fin.

In some example embodiments, the first width is smaller than the second width.

In some example embodiments, the spacer has a uniform width in the first direction.

In some example embodiments, a third width of the spacer in the first area along the first direction is greater than a fourth width of the spacer in the second area along the first direction.

In some example embodiments, the sum of the first width and the third width is equal to the sum of the second width and the fourth width.

In some example embodiments, wherein a width of the spacer disposed on a side of the gate structure in the first direction is different from a width of another spacer disposed on the other side of the gate structure which is opposite the side of the gate structure.

In some example embodiments, wherein the first width and the second width change continuously along a direction in which the gate structure extends.

In some example embodiments, wherein the active fin includes a first active fin and a second active fin which are arranged sequentially and separated in the second direction, and an area between the first active fin and the second active fin is the first area.

In some example embodiments, the area between the first active fin and the second active fin includes a filed insulating layer.

According to another aspect, there is provided a semiconductor device including an active fin which extends along a first direction and has a protruding shape, a field insulating layer which covers at least part of the active fin, a gate structure which is disposed on the active fin and the field insulating layer to extend along a second direction and includes a first area and a second area which is adjacent to the first area in the second direction and spacers which are respectively disposed on both sides of the gate structures and define a width of the gate structure, wherein the first area is disposed on the field insulating layer, and the second area is disposed on the active fin, and a first width which is a distance between the spacers in the first area is smaller than a second width which is a distance between the spacers in the second area.

In some example embodiments, the spacers extend continuously along both the first area and the second area.

In some example embodiments, each of the spacers has a uniform width in the first direction.

In some example embodiments, a third width of each of the spacers in the first area along the first direction is greater than a fourth width of each of the spacers in the second area along the first direction.

In some example embodiments, the sum of the first width and the third width is equal to the sum of the second width and the fourth width.

According to another aspect, there is provided a semiconductor device including an active fin which extends along a first direction and has a protruding shape, a field insulating layer which covers at least part of the active fin and a gate structure which is disposed on the active fin and the field insulating layer to extend along a second direction and includes a first area and a second area which is adjacent to the first area in the second direction, wherein the first area is disposed on the field insulating layer, and the second area is disposed on the active fin, and wherein a first width of the first area in the first direction is smaller than a second width of the second area in the first direction, In some example embodiments, the first width and the second width maintain constant along a direction in which the gate structure extends.

In some example embodiments, one of sidewalls of the gate structure is flat over the first region and the second region.

In some example embodiments, the first width and the second width change continuously along a direction in which the gate structure extends.

In some example embodiments, the gate structure includes a gate electrode and a gate insulating layer disposed on a bottom and sidewalls of the gate electrode.

BRIEF DESCRIPTION OF THE DRAWINGS

The above and other aspects and features will become more apparent by describing in detail exemplary embodiments with reference to the attached drawings, in which.

DETAILED DESCRIPTION OF EXAMPLE EMBODIMENTS

Figure 1:
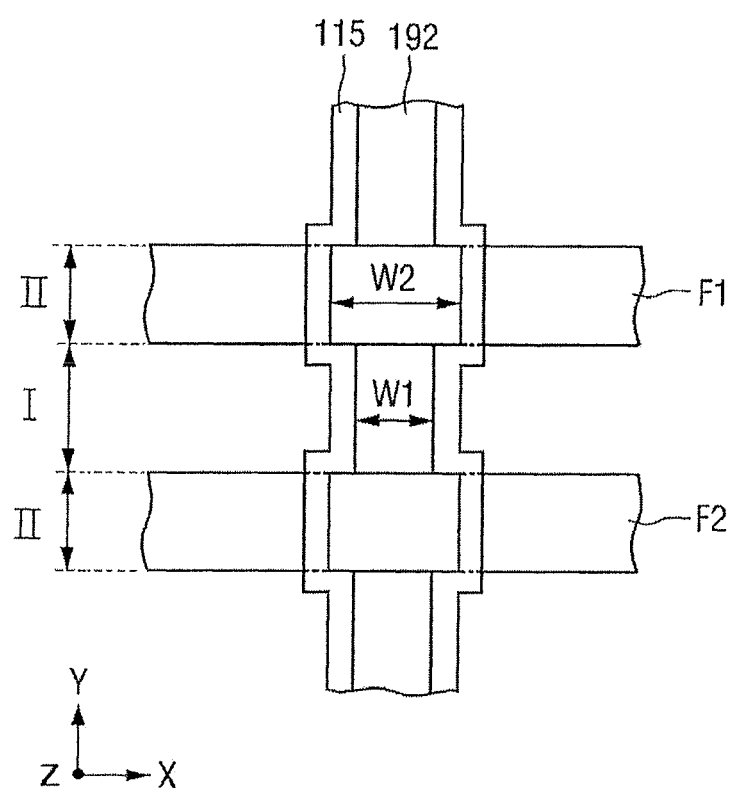
FIG. 1 is a partial layout view of a semiconductor device according to an embodiment.

Advantages and features of the present disclosure and methods of accomplishing the same may be understood more readily by reference to the following detailed description of preferred example embodiments and the accompanying drawings. The present disclosure may, however, be embodied in many different forms and should not be construed as being limited to the example embodiments set forth herein. Rather, these example embodiments are provided so that this disclosure will be thorough and complete and will fully convey the concept of the present disclosure to those skilled in the art, and the present disclosure will only be defined by the appended claims. Like reference numerals refer to like elements throughout the specification.

The terminology used herein is for the purpose of describing particular example embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, these example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

A semiconductor device according to an embodiment will now be described with reference to FIGS. 1 through 3.

FIG. 1 is a partial layout view of a semiconductor device according to an embodiment. FIG. 2 is a cross-sectional view of the semiconductor device of FIG. 1, taken along a direction indicated by an arrow W1. FIG. 3 is a cross-sectional view of the semiconductor device of FIG. 1, taken along a direction indicated by an arrow W2.

A case where the semiconductor device according to the current embodiment includes fin field effect transistors (FinFETs) will hereinafter be described as an example. However, the present disclosure is not limited to this case. The technical spirit of the present disclosure is also applicable to a semiconductor device including three-dimensional semiconductor elements (e.g., transistors using nanowires) instead of FinFETs.

Figure 2:
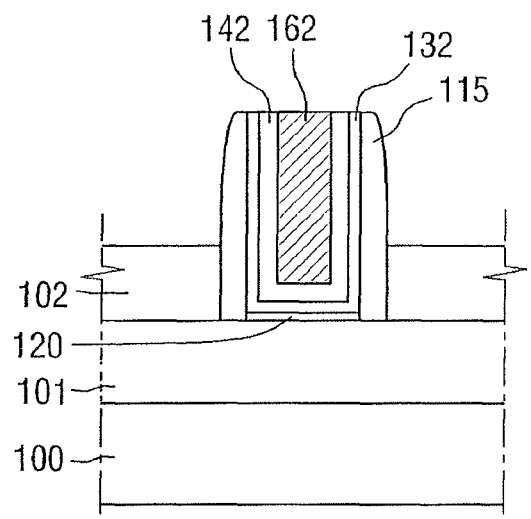
FIG. 2 is a cross-sectional view of the semiconductor device of FIG. 1, taken along a direction indicated by an arrow W1.
Figure 3:
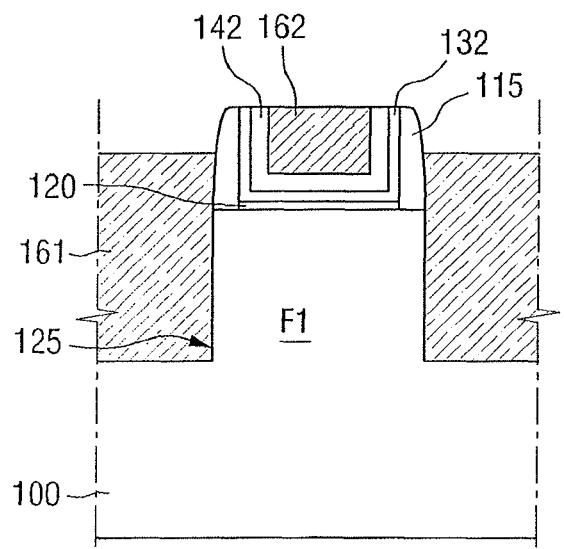
FIG. 3 is a cross-sectional view of the semiconductor device of FIG. 1, taken along a direction indicated by an arrow W2.

Referring to FIGS. 1 through 3, the semiconductor device according to the current embodiment may include a first active fin F1, a second active fin F2, a gate structure 192, and spacers 115.

The first active fin F1 and the second active fin F2 may protrude from an active layer 100 in a third direction Z. In some example embodiments, the first active fin F1 and the second active fin F2 may be formed by partially etching the active layer 100, but the present disclosure is not limited thereto.

Although two active fins F1 and F2 are illustrated in the current embodiment, the technical spirit of the present disclosure is not limited thereto. Therefore, the technical spirit of the present disclosure is also applicable to a case where more than two active fins are included in the semiconductor device.

In some example embodiments, the active layer 100 may be a semiconductor substrate. When the active layer 100 is a semiconductor substrate, the semiconductor substrate may be formed of one or more semiconductor materials including Si, Ge, SiGe, GaP, GaAs, SiC, SiGeC, InAs and/or InP.

In some other example embodiments, the active layer 100 may be an epitaxial layer made of a semiconductor material. When the active layer 100 is an epitaxial layer, the epitaxial layer may include an element semiconductor material such as silicon or germanium.

In addition, the epitaxial layer may include a compound semiconductor such as a group IV-IV compound semiconductor or a group III-V compound semiconductor. Specifically, the group IV-IV compound semiconductor that forms the epitaxial layer may be a binary or ternary compound containing two or more of carbon (C), silicon (Si), germanium (Ge) and tin (Sn) or a compound obtained by doping the binary or ternary compound with a group IV element. The group III-V compound semiconductor that forms the epitaxial layer may be a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

Here, the epitaxial layer may be formed on, for example, an insulating substrate. In other words, the active layer 100 may be formed as a silicon-on-insulator (SOI) substrate.

When the active layer 100 is formed as an SOI substrate, the delay time in the operation process of the semiconductor device according to the current embodiment can be reduced.

In the current embodiment, the first active fin F1 and the second active fin F2 may be disposed in a second area II. The current embodiment will be described based on the assumption that all of the first and second active fins F1 and F2 are disposed in the second area II. However, the technical spirit of the present disclosure is not limited by this assumption.

Each of the first active fin F1 and the second active fin F2 may extend along a first direction X. The first active fin F1 and the second active fin F2 may be sequentially arranged and separated from each other along a second direction Y that intersects the first direction X.

In the current embodiment, the gate structure 192 may include a first area I and the second area II. Here, the second area II may be disposed adjacent to the first area I in the second direction Y.

In the current embodiment, a first width W1 of the first area I in the first direction X may be different from a second width W2 of the second area II in the first direction X. Specifically, the first width W1 may be smaller than the second width W2.

In the current embodiment, each of the first and second areas I and II may be symmetrical with respect to a centerline of the gate structure 192. In other words, a distance from the centerline of the gate structure 192 to a side of the first area I may be equal to another distance from the centerline of the gate structure 192 to the other side of the first area I.

A field insulating layer 101 may cover side surfaces of the first active fin F1 and the second active fin F2. Specifically, the field insulating layer 101 may cover a lower part of each of the first active fin F1 and the second active fin F2. In some example embodiments, the field insulating layer 101 may be, for example, an insulating layer. More specifically, the field insulating layer 101 may be, but is not limited to, a silicon oxide ($SiO_2$) layer, a silicon nitride (SiN) layer, or a silicon oxynitride (SiON) layer.

The gate structure 192 may be disposed on the first active fin F1 and the second active fin F2 to extend along the second direction Y. The spacers 115 may be disposed on both sides of the gate structure 192, respectively. The spacers 115 may be disposed on the first active fin F1 and the second active fin F2 to extend along the second direction Y.

The spacers 115 which face each other may be formed parallel to each other. In addition, the spacers 115 may extend upward from the field insulating layer 101 to a height equal to a top surface of the gate structure 192. However, the present disclosure is not limited thereto. Therefore, the spacers 115 can also be lower than the top surface of the gate structure 192.

In the current embodiment, the spacers 115 may extend continuously along both the first area I and the second area II. That is, the spacers 115 may not expose sidewalls of the gate structures 192 in the first area I and the second area II. The spacers 115 included in the semiconductor device according to the present disclosure may be disposed on both sidewalls of the gate structure 192 regardless of areas where they are located.

In the current embodiment, the first width W1 and the second width W2 of the gate structure 192 may be defined by the spacers 115. That is, each of the first width W1 and the second width W2 may be defined by a distance between the spacers 115 disposed on both sides of the gate structure 192 in each area where the spacers 115 are located. Here, the distance between the spacers 115 may denote a distance between inner surfaces of the spacers 115 which contact the sidewalls of the gate structure 192.

In the current embodiment, each of the spacers 115 is illustrated as a single layer. However, the present disclosure is not limited thereto. Therefore, each of the spacers 115 can also include a plurality of layers.

In some example embodiments, the first area I of the gate structure 192 may be disposed on an area between the first active fin F1 and the second active fin F2. The area between the first active fin F1 and the second active fin F2 may include the field insulating layer 101.

The second area II of the gate structure 192 may be disposed on the first active fin F1 and the second active fin F2. In the current embodiment, a transistor may be formed in part of each of the first area I and the second area II. The transistor may include the gate structure 192, the spacers 115, and source/drain regions 161.

Referring again to FIGS. 2 and 3, the gate structure 192 may include an interface layer 120, a gate insulating layer 132, a work function control layer 142, and a gate electrode 162 formed sequentially on the first active fin F1 and the second active fin F2.

The interface layer 120 may be formed on the field insulating layer 101 and the first and second active fins F1 and F2 to extend along the second direction Y. The interface layer 120 may include a low-k material layer having a dielectric constant (k) of 9 or less such as a silicon oxide layer (k is approximately 4) or a silicon oxynitride layer (k is approximately 4 to 8 according to contents of oxygen atoms and nitrogen atoms). Alternatively, the interface layer 120 may be made of silicate or any combination of the above example layers.

The gate insulating layer 132 may be disposed on the interface layer 120. Specifically, the gate insulating layer 132 may extend along the second direction Y and partially cover a top surface of each of the first and second active fins F1 and F2. The gate insulating layer 132 may extend upward along sidewalls of the spacers 115 disposed on both sides of the gate electrode 162. In the current embodiment, the gate insulating layer 132 is shaped as described above because it is formed by a replacement process (or a gate last process). However, the present disclosure is not limited thereto, and the shape of the gate insulating layer 132 can be changed as desired.

That is, in some other example embodiments of the present disclosure, the gate insulating layer 132 may be formed by a gate first process. In this case, the gate insulating layer 132 may not extend upward along the sidewalls of the spacers 115, unlike in the drawings.

The gate insulating layer 132 may be made of a high-k material. In some example embodiments, the gate insulating layer 132 may be made of a material such as, but not limited to, $HfO_2$, $Al_2O_3$, $ZrO_2$, or $TaO_2$.

The work function control layer 142 may be disposed on the gate insulating layer 132. The work function control layer 142 may extend along the second direction Y to partially cover the top surface of each of the first and second active fins F1 and F2. Like the gate insulating layer 132, the work function control layer 142 may extend upward along the sidewalls of the spacers 115. In the current embodiment, the work function control layer 142 is shaped as described above because it is formed by a replacement process (or a gate last process). However, the present disclosure is not limited thereto, and the shape of the work function control layer 142 can be changed as desired.

The work function control layer 142 may be a layer used to control a work function of a transistor. The work function control layer 142 may be at least one of an n-type work function control layer and a p-type work function control layer. If the work function control layer 142 according to the current embodiment is an n-type work function control layer, it may include, but not limited to, TiAl, TiAlN, TaC, TaAlN, TiC, or HfSi.

On the other hand, if the work function control layer 142 according to the current embodiment is a p-type work function control layer, it may include, for example, metal nitride. Specifically, in some example embodiments, the work function control layer 142 may include at least one of, e.g., TiN and TaN. More specifically, the work function control layer 142 may be, but is not limited to, a single layer made of TiN or a double layer composed of a lower TiN layer and an upper TaN layer.

The gate electrode 162 may be disposed on the work function control layer 142. The gate electrode 162 may extend along the second direction Y to partially cover the top surface of each of the first and second active fins F1 and F2.

The gate electrode 162 may include a material with high conductivity. In some example embodiments, the gate electrode 162 may include a metal. Examples of the metal may include, but not limited to, Al and W.

In the present disclosure, the gate electrode 162 disposed in the first area I may not include W, and the gate electrode 162 disposed in the second area II may include W. This is because filling characteristics of W in the gate structure 192 change according to the first width W1 and the second width W2 of the gate structure 192. This will be described later.

Recesses 125 may be formed in the first active fin F1 and the second active fin F2 on both sides of the gate structure 192. Since the recesses 125 have sloping sidewalls, they may become wider as the distance from the active layer 100 increases. As illustrated in FIG. 3, the recesses 125 may be wider than the first active fin F1 and the second active fin F2.

The source/drain regions 161 may be formed in the recesses 125, respectively. In some example embodiments, the source/drain regions 161 may be elevated source/drain regions. That is, top surfaces of the source/drain regions 161 may be higher than those of the first and second active fins F1 and F2. In addition, the source/drain regions 161 may be insulated from the gate structure 192 by the spacers 115.

If the transistor thus formed is a p-type transistor, the source/drain regions 161 may include a compressive stress material. In an example, the compressive stress material may be a material (e.g., SiGe) having a greater lattice constant than Si. The compressive stress material may improve the mobility of carriers in a channel region by applying compressive stress to the first and second active fins F1 and F2.

If the transistor formed is an n-type transistor, the source/drain regions 161 may include the same material as the active layer 100 or a tensile stress material. For example, if the active layer 100 includes Si, the source/drain regions 161 may include Si or a material (e.g., SiC) having a smaller lattice constant than Si.

In the current embodiment, a case where the recesses 125 are formed in the first active fin F1 and the second active fin F2 and where the source/drain regions 161 are formed in the recesses 125 is illustrated as an example. However, the present disclosure is not limited to this case. In some other example embodiments of the present disclosure, the source/drain regions 161 can also be formed in the first and second active fins F1 and F2 by injecting impurities directly into the first and second active fins F1 and F2.

Although only part of an interlayer insulating film 102 is illustrated in FIG. 2 for ease of understanding, the interlayer insulating film 102 may cover the source/drain regions 161 and the gate structure 192.

The interlayer insulating film 102 may include at least one of a low-k material, an oxide layer, a nitride layer, and an oxynitride layer. The low-k material may be, but is not limited to, Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SiLK, polyimide, porous polymeric material, or a combination thereof.

The interlayer insulating film 102 may be formed of, e.g., tetraethylortho silicate (TEOS).

In the current embodiment, the gate structure 192 disposed on the first active fin F1 and the second active fin F2 may have the second width W2, and the gate structure 192 disposed between the first active fin F1 and the second active fin F2 may have the first width W1.

In other words, the gate structure 192 disposed on the field insulating layer 101 is narrower than the gate structure 192 disposed on the first and second active fins F1 and F2. This can improve the reliability of the semiconductor device.

If the gate structure 192 includes W in the gate electrode 162, a lower region of the gate structure 192 disposed on the first active fin F1 and the second active fin F2 may have tensile pressure, and an upper region thereof may have compressive pressure. Due to these pressures, W may fail to fully fill the gate electrode 162 included in the gate structure disposed between the first active fin F1 and the second active fin F2, thus allowing oxygen to be introduced into the gate electrode 162.

In this case, the reliability of the semiconductor device cannot be ensured.

Therefore, in the present disclosure, the reliability of the semiconductor device is improved by varying the width of the gate structure 192 according to the area where the gate structure 192 is disposed.

More specifically, the first width W1 of the gate structure 192 disposed on the first area I may be 14 nm, and the second width W2 of the gate structure 192 disposed on the second area II may be 16 nm. When the gate structure 192 has a width of 14 nm, ALD TiN, instead of W, may be used to fill the gate structure 192. However, the technical spirit of the present disclosure is not limited thereto.

That is, since the gate electrode 162 of the gate structure 192 in the second area II does not include W, the above-described problem can be solved.

Figure 4:
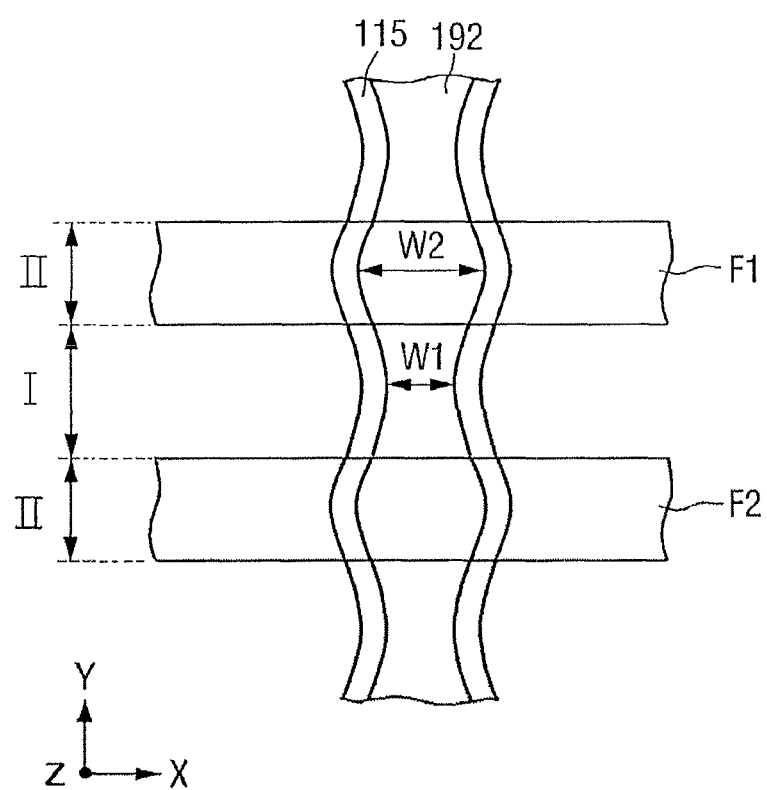
FIG. 4 is a partial layout view of a semiconductor device according to another embodiment.

FIG. 4 is a partial layout view of a semiconductor device according to another embodiment.

The semiconductor device according to the current embodiment is substantially the same as the semiconductor device according to the previous embodiment of FIG. 1 except that sidewalls of spacers 115 and sidewalls of a gate structure 192 are curved. In the current embodiment, elements substantially identical to those of the previous embodiment of FIG. 1 are indicated by like reference numerals, and thus any repetitive description thereof will be omitted.

In the current embodiment, since the sidewalls of the spacers 115 and the sidewalls of the gate structures 192 are curved, a first width W1 and a second width W2 may be continuously changed.

That is, the first width W1 may be continuously changed such that it is the largest at a point adjacent to a first active fin F1 or a second active fin F2 along a second direction Y and the smallest at a midpoint between the first active fin F1 and the second active fin F2 along the second direction Y.

The second width W2 may be continuously changed such that it is the smallest at an outer point of the first active fin F1 or the second active fin F2 along the second direction Y and the largest at a midpoint of the first active fin F1 or the second active fin F2 along the second direction Y In the current embodiment, each of a first area I and a second area II may be symmetrical with respect to a centerline of the gate structure 192. In other words, a distance from the centerline of the gate structure 192 to a side of the first area I may be equal to a distance from the centerline of the gate structure 192 to the other side of the first area I. However, the present disclosure is not limited thereto, and the semiconductor device according to the current embodiment can have various shapes.

Figure 5:
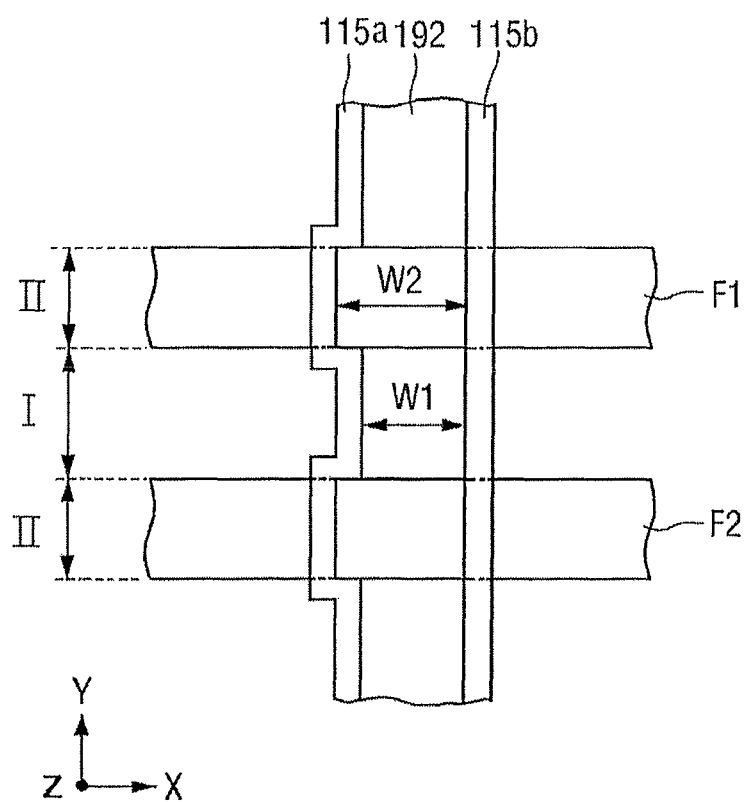
FIG. 5 is a partial layout view of a semiconductor device according to another embodiment.

FIG. 5 is a partial layout view of a semiconductor device according to another embodiment.

The semiconductor device according to the current embodiment is substantially the same as the semiconductor device according to the previous embodiment of FIG. 1 except that a sidewall of one spacer 115 and a sidewall of a gate structure 192 are flat. In the current embodiment, elements substantially identical to those of the previous embodiment of FIG. 1 are indicated by like reference numerals, and thus any repetitive description thereof will be omitted.

Referring to FIG. 5, a first spacer 115 has a bending shape, and a second spacer 115b has a linear shape.

That is, in the current embodiment, a first width W1 of a first area I and a second width W2 of a second area II are determined by the shape of sidewalls of the first and second spacers 115a and 115b.

In the current embodiment, each of the first area I and the second area II may be asymmetrical with respect to a centerline of the gate structure 192. In other words, a distance from the centerline of the gate structure 192 to a side of the first area I may be different from another distance from the centerline of the gate structure 192 to the other side of the first area I.

Figure 6:
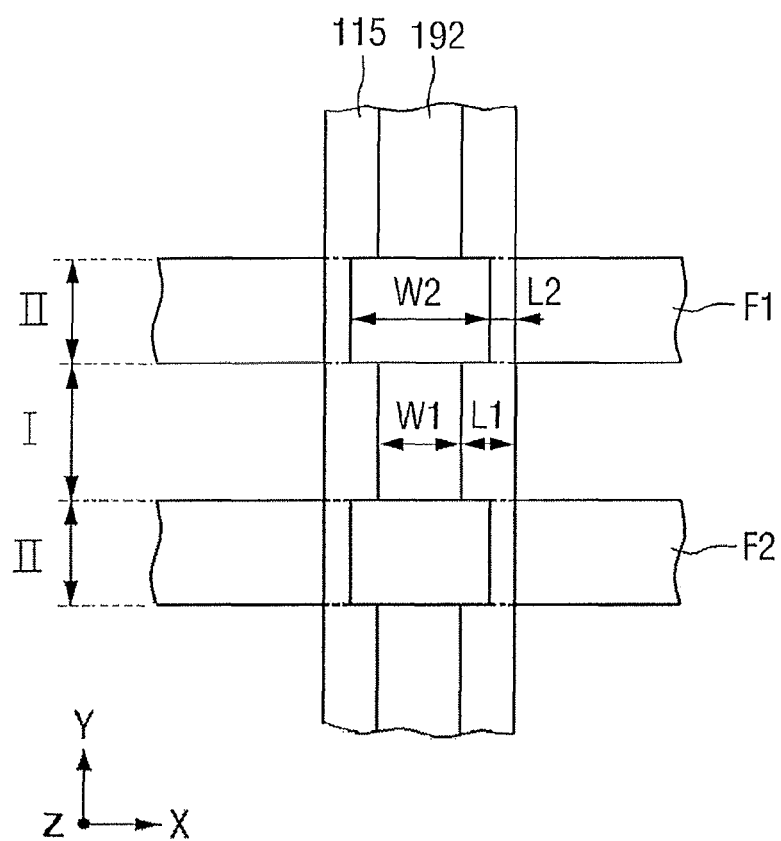
FIG. 6 is a partial layout view of a semiconductor device according to another embodiment.

FIG. 6 is a partial layout view of a semiconductor device according to another embodiment.

Figure 7:
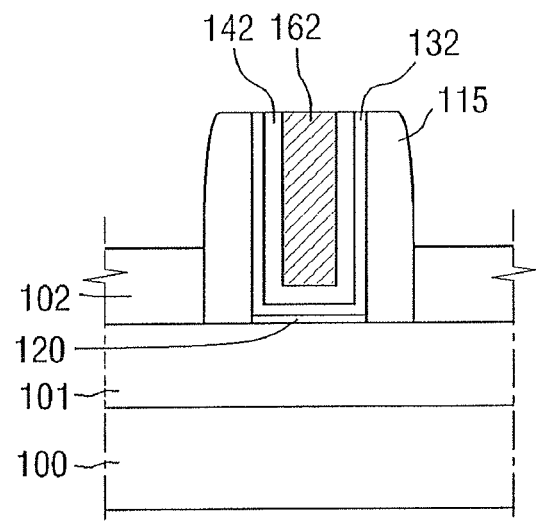
FIG. 7 is a cross-sectional view of the semiconductor device of FIG. 6, taken along a direction indicated by arrows W1 and L1.
Figure 8:
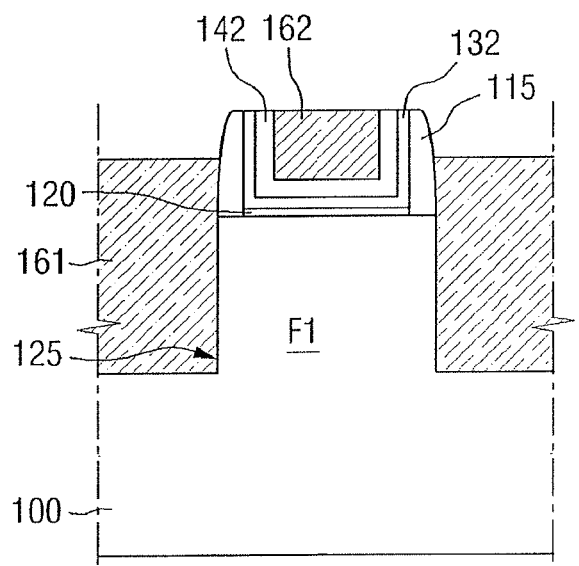
FIG. 8 is a cross-sectional view of the semiconductor device of FIG. 6, taken along a direction indicated by arrows W2 and L2.

FIG. 7 is a cross-sectional view of the semiconductor device of FIG. 6, taken along a direction indicated by arrows W1 and L1. FIG. 8 is a cross-sectional view of the semiconductor device of FIG. 6, taken along a direction indicated by arrows W2 and L2.

The semiconductor device according to the current embodiment is substantially the same as the semiconductor device according to the previous embodiment of FIG. 1 except that each of spacers 115 disposed on sidewalls of a gate structure 192 has a varying width according to area. In the current embodiment, elements substantially identical to those of the previous embodiment of FIG. 1 are indicated by like reference numerals, and thus any repetitive description thereof will be omitted.

Referring to FIGS. 6 through 8, the spacers 115 disposed in a first area I have a third width L1 in a first direction X. The spacers 115 disposed in a second area II have a fourth width L2 in the first direction X.

The third width L1 of the first area I is greater than the fourth width L2 of the second area II. In addition, the sum of a first width W1 and the third width L1 in the first area I is equal to the sum of a second width W2 and the fourth width L2 in the second area II. That is, since the spacers 115 have different thicknesses according to area, outer sidewalls of the spacers 115 may be flat.

To make the outer walls of the spacers 115 flat, the third width L1 and the fourth width L2 of the spacers 115 may be large enough to offset bends of the gate structure 192.

In the current embodiment, each of the first area I and the second area II may be symmetrical with respect to a centerline of the gate structure 192. In other words, a distance from the centerline of the gate structure 192 to a side of the first area I may be equal to a distance from the centerline of the gate structure 192 to the other side of the first area I.

Referring to the cross-sectional views of FIGS. 7 and 8, the spacers 115 of the first area I are relatively thicker than those in the cross-sectional views of FIGS. 2 and 3.

Figure 9:
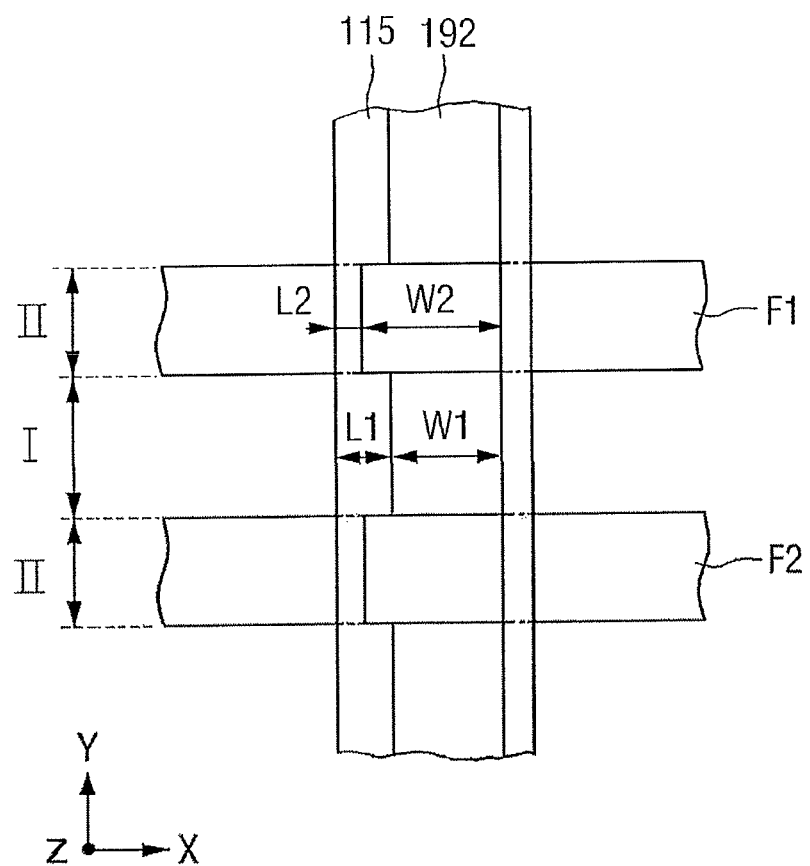
FIG. 9 is a partial layout view of a semiconductor device according to another embodiment.

FIG. 9 is a partial layout view of a semiconductor device according to another embodiment.

Figure 10:
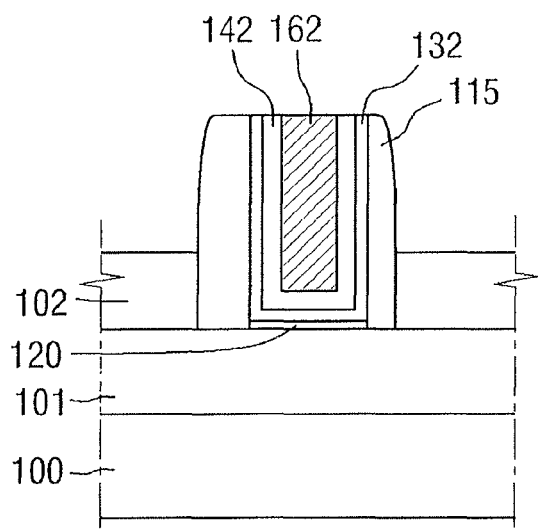
FIG. 10 is a cross-sectional view of the semiconductor device of FIG. 9, taken along a direction indicated by arrows W1 and L1.
Figure 11:
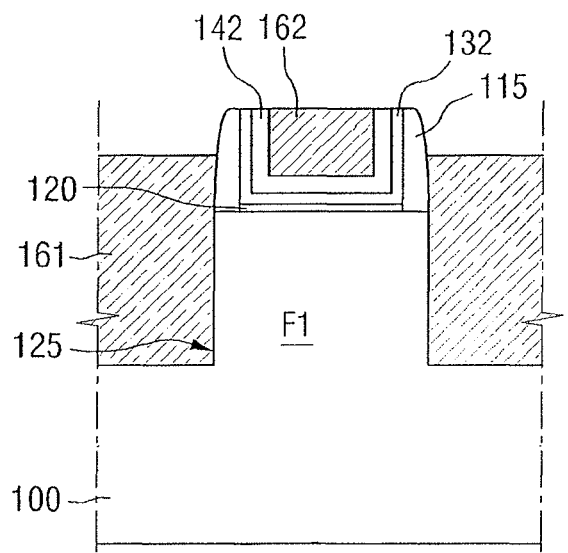
FIG. 11 is a cross-sectional view of the semiconductor device of FIG. 9, taken along a direction indicated by arrows W2 and L2.

FIG. 10 is a cross-sectional view of the semiconductor device of FIG. 9, taken along a direction indicated by arrows W1 and L1. FIG. 11 is a cross-sectional view of the semiconductor device of FIG. 9, taken along a direction indicated by arrows W2 and L2.

The semiconductor device according to the current embodiment is substantially the same as the semiconductor device according to the previous embodiment of FIG. 1 except that a spacer 115 disposed on a sidewall of a gate structure 192 has a varying width according to area. In the current embodiment, elements substantially identical to those of the previous embodiment of FIG. 1 are indicated by like reference numerals, and thus any repetitive description thereof will be omitted.

Referring to FIGS. 9 through 11, a width of a spacer 115 disposed on a sidewall of the gate structure 192 varies according to area.

Specifically, one sidewall of the gate structure 192 is bent, and the spacer 115 disposed on the sidewall of the gate structure 192 has a third width L1 or a fourth width L2 according to area.

That is, the spacer 115 may have the third width L1 in a first area I and the fourth width L2 in a second area II. As illustrated in the drawings, the third width L1 is greater than the fourth width L2. That is, as in the embodiment of FIG. 6, in the current embodiment, the bent sidewall of the gate structure 192 may be covered by the spacer 115 having a different thickness according to area.

Referring again to FIGS. 10 and 11, a spacer 115 disposed on a left sidewall of the gate structure 192 in the first area I is relatively thicker than a spacer 115 disposed on a right sidewall of the gate structure 192 in the first area I.

In the current embodiment, the spacers 115 on both sidewalls of the gate structure 192 may have different thicknesses.

Figure 12:
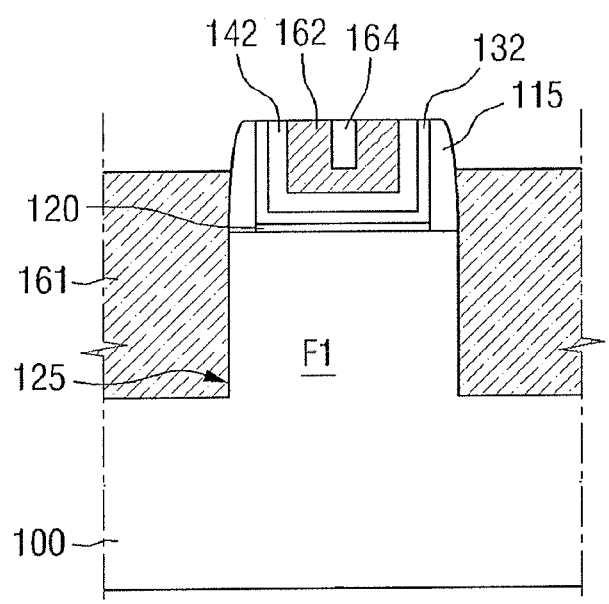
FIG. 12 is a cross-sectional view of a semiconductor device according to another embodiment.

FIG. 12 is a cross-sectional view of a semiconductor device according to another embodiment.

The semiconductor device according to the current embodiment is substantially the same as the semiconductor device according to the previous embodiment of FIG. 1 except that a gate metal 164 is included in a gate electrode 162 of a gate structure 192. In the current embodiment, elements substantially identical to those of the previous embodiment of FIG. 1 are indicated by like reference numerals, and thus any repetitive description thereof will be omitted Referring to FIG. 12, the gate structure 192 disposed on a first active fin F1 includes the gate metal 164 whose side surfaces are surrounded by the gate structure 162. The gate metal 164 may include metal such as W.

On the other hand, the gate structure 192 not disposed on the first active fin F1 or a second active fin F2 may not include W as described above.

Figure 13:
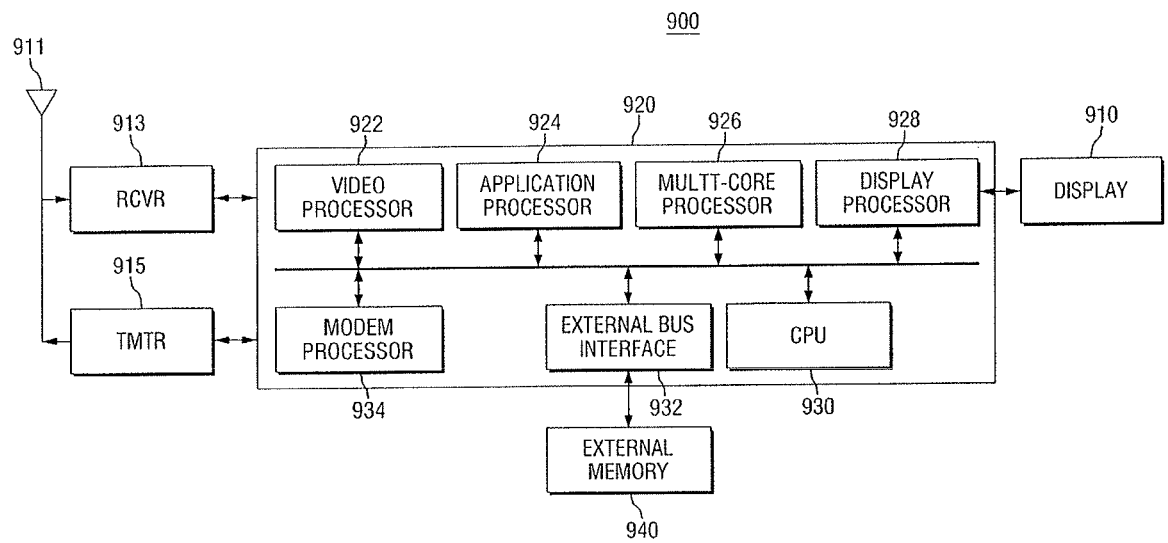
FIG. 13 is a block diagram of a wireless communication device including semiconductor devices according to example embodiments.

FIG. 13 is a block diagram of a wireless communication device 900 including semiconductor devices according to example embodiments.

Referring to FIG. 13, the wireless communication device 900 may be a cellular phone, a smartphone terminal, a handset, a personal digital assistant (PDA), a laptop computer, a video game unit, or some other device. The device 900 may use Code Division Multiple Access (CDMA), Time Division Multiple Access (TDMA) such as Global System for Mobile communications (GSM), or some other wireless communication standard.

The device 900 may provide bidirectional communication via a receive path and a transmit path. On the receive path, signals transmitted by one or more base stations may be received by an antenna 911 and provided to a receiver (RCVR) 913. The RCVR 913 conditions and digitizes the received signal and provides samples to a digital section 120 for further processing. On the transmit path, a transmitter (TMTR) 915 receives data transmitted from the digital section 120, processes and conditions the data, generates a modulated signal, and transmits the modulated signal to one or more base stations via the antenna 911.

The digital section 920 may be implemented with one or more digital signal processors (DSPs), microprocessors, reduced instruction set computers (RISCs), etc. In addition, the digital section 920 may be fabricated on one or more application specific integrated circuits (ASICs) or some other type of integrated circuits (ICs).

The digital section 920 may include various processing and interface units such as, for example, a modem processor 934, a video processor 922, an application processor 924, a display processor 928, a controller/multi-core processor 926, a central processing unit (CPU) 930, and an external bus interface (EBI) 932.

The video processor 922 may perform processing for graphics applications. Generally, the video processor 922 may include any number of processing units or modules for any set of graphics operations. Certain portions of the video processor 922 may be implemented in firmware and/or software.

For example, a control unit may be implemented with firmware and/or software modules (e.g., procedures, functions, etc.) that perform functions described herein. The firmware and/or software codes may be stored in a memory and executed by a processor (e.g., the multi-core processor 926). The memory may be implemented inside or outside the processor.

The video processor 922 may implement a software interface such as Open Graphics Library (OpenGL), Direct3D, etc. The CPU 930 may execute a series of graphics processing operations, together with the video processor 922.

The controller/multi-core processor 926 may include two or more cores. The controller/multi-core processor 926 may allocate a workload to be processed to two cores according to the workload and process the workload simultaneously.

In the drawing, the application processor 924 is illustrated as an element of the digital section 920. However, the present disclosure is not limited thereto. In some example embodiments, the digital section 920 may be integrated into one application processor 924 or one application chip.

The modem processor 934 may perform operations needed to deliver data between the RCVR 913 and the TMTR 915 and the digital section 920. The display processor 928 may perform operations needed to drive a display 910.

The semiconductor devices according to the above-described example embodiments may be used as a cache memory or buffer memory utilized for the operations of the processors 922, 924, 926, 928, 930 and 934.

A computing system including semiconductor devices according to example embodiments will now be described with reference to FIG. 14.

Figure 14:
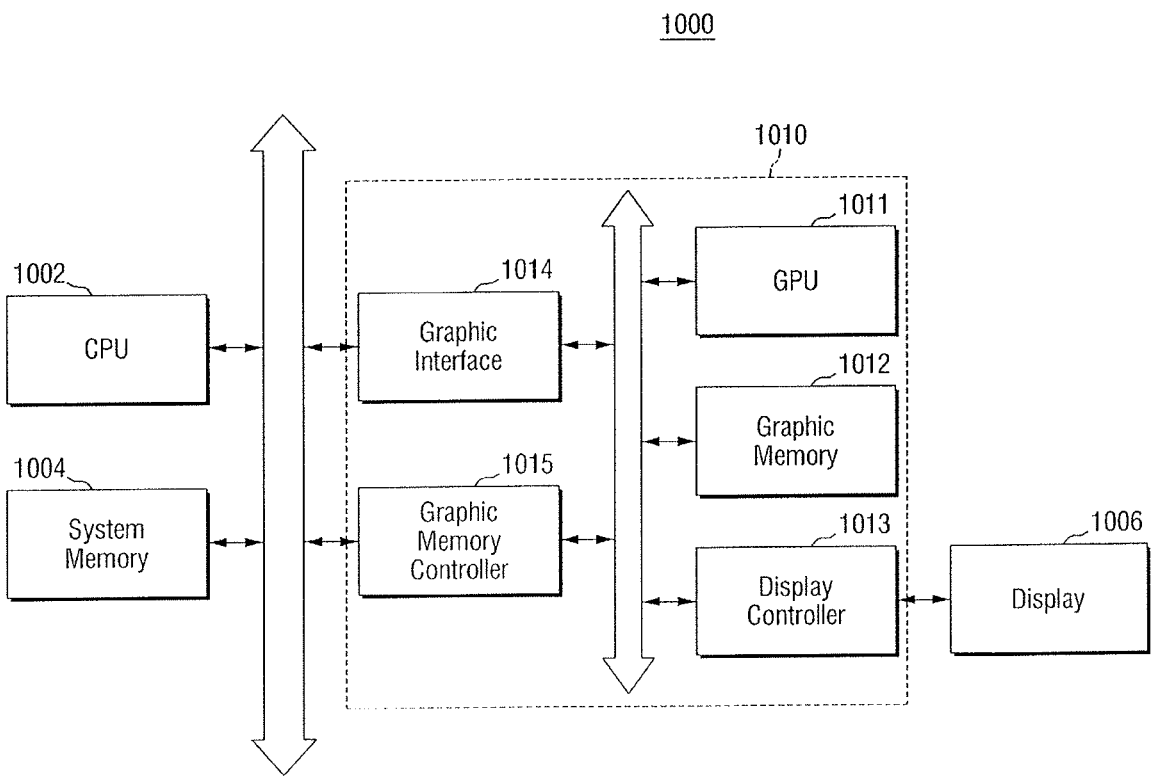
FIG. 14 is a block diagram of a computing system including semiconductor devices according to example embodiments.

FIG. 14 is a block diagram of a computing system 1000 including semiconductor devices according to example embodiments.

Referring to FIG. 14, the computing system 1000 according to an embodiment includes a CPU 1002, a system memory 1004, a graphic system 1010, and a display 1006.

The CPU 1002 may perform operations needed to drive the computing system 1000. The system memory 1004 may be configured to store data. The system memory 1004 may store data processed by the CPU 1002. The system memory 1004 may function as a working memory of the CPU 1002.

The system memory 1004 may include one or more volatile memories such as a double data rate static dynamic random access memory (DDR SDRAM) or a static data rate SDRAM (SDR SDRAM) and/or one or more nonvolatile memories such as an electrical erasable programmable read-only memory (EEPROM) or a flash memory. Any one of the semiconductor devices according to the above-described example embodiments may be employed as an element of the system memory 1004.

The graphic system 1010 may include a graphic processing unit (GPU) 1011, a graphic memory 1012, a display controller 1013, a graphic interface 1014, and a graphic memory controller 1015.

The GPU 1011 may perform graphic operations needed for the computing system 1000. Specifically, the GPU 1011 may assemble primitives, each composed of one or more vertices, and perform rendering using the assembled primitives.

The graphic memory 1012 may store graphic data processed by the GPU 1011 or graphic data provided to the GPU 1011. In addition, the graphic memory 1012 may function as a working memory of the GPU 1011. Any one of the semiconductor devices according to the above-described example embodiments may be employed as an element of the graphic memory 1012.

The display controller 1013 may control the display 1006 to display a rendered image frame.

The graphic interface 1014 may perform interfacing between the CPU 1002 and the GPU 1011, and the graphic memory controller 1015 may provide memory access between the system memory 1004 and the GPU 1011.

Although not illustrated in FIG. 14, the computing system 1000 may further include one or more input devices such as buttons, a touch screen, or a microphone, and/or one or more output devices such as a speaker. In addition, the computing system 1000 may further include an interface for exchanging data with an external device in a wired or wireless manner. For example, the interface may be an antenna or a wired/wireless transceiver.

Depending on example embodiments, the computing system 1000 may be any computing system such as a mobile phone, a smartphone, a PDA, a desktop computer, a notebook computer, a tablet computer, or the like.

An electronic system including semiconductor devices according to example embodiments will now be described with reference to FIG. 15.

Figure 15:
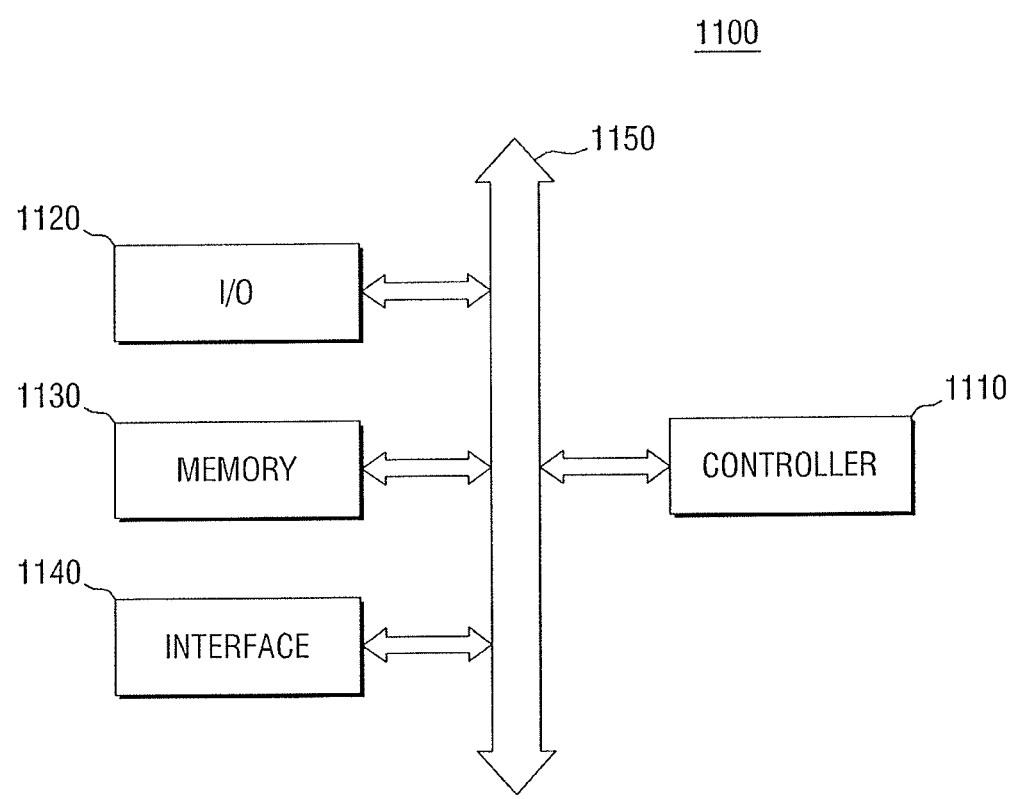
FIG. 15 is a block diagram of an electronic system including semiconductor devices according to example embodiments.

FIG. 15 is a block diagram of an electronic system 1100 including semiconductor devices according to example embodiments.

Referring to FIG. 15, the electronic system 1100 according to an embodiment may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver.

Although not illustrated in the drawing, the electronic system 1100 may be a working memory for improving the operation of the controller 1110, and may also include a high-speed DRAM or static random access memory (SRAM). Here, any one of the semiconductor devices according to the above-described example embodiments may be employed as the working memory. In addition, any one of the semiconductor devices according to the above-described example embodiments may be provided in the memory device 1130 or in the controller 1110 or the I/O device 1120.

The electronic system 1100 may be applied to a PDA, a portable computer, a web tablet, a wireless phone, a mobile phone, a digital music player, a memory card, or nearly all types of electronic products capable of transmitting and/or receiving information in a wireless environment.

Figure 16:
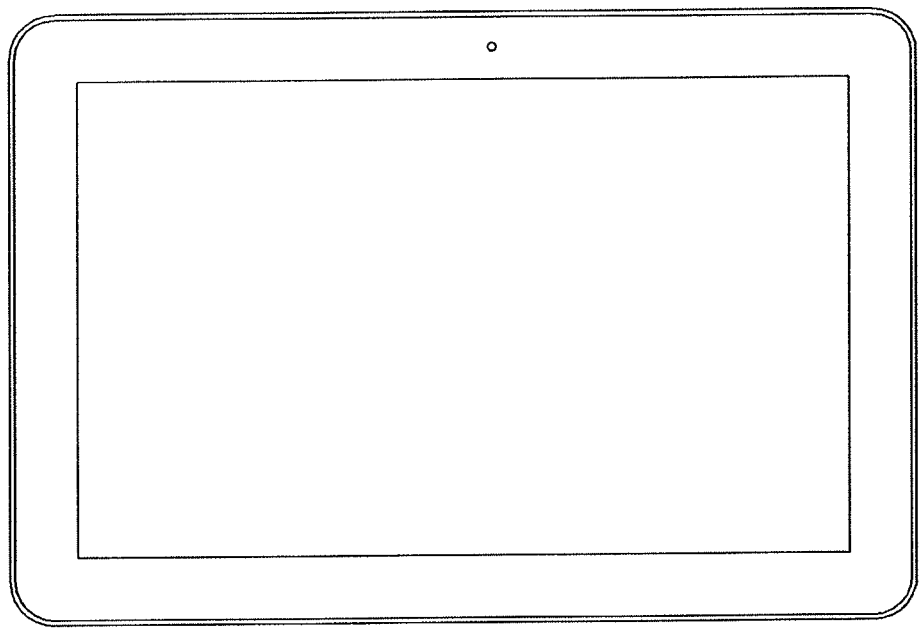
FIGS. 16 through 18 illustrate examples of a semiconductor system to which semiconductor devices according to example embodiments can be applied.
Figure 17:
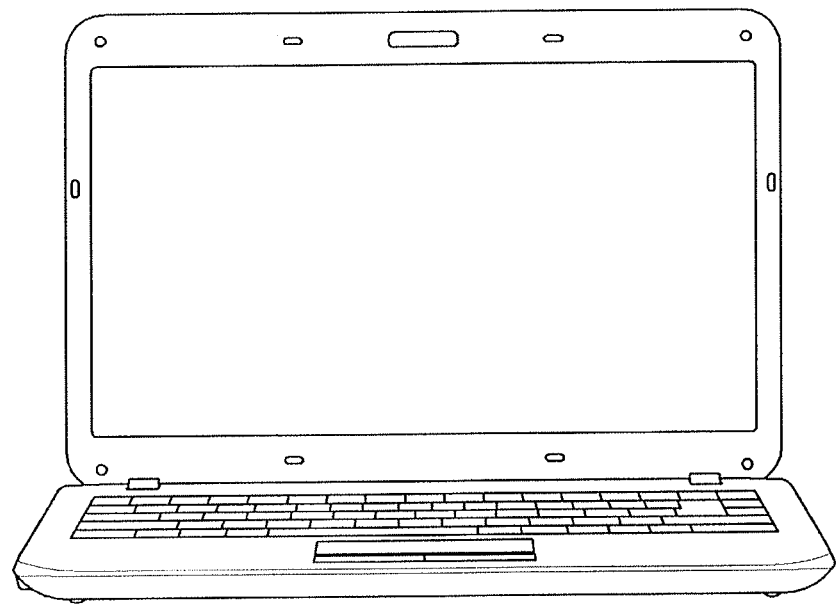
Figure 18:
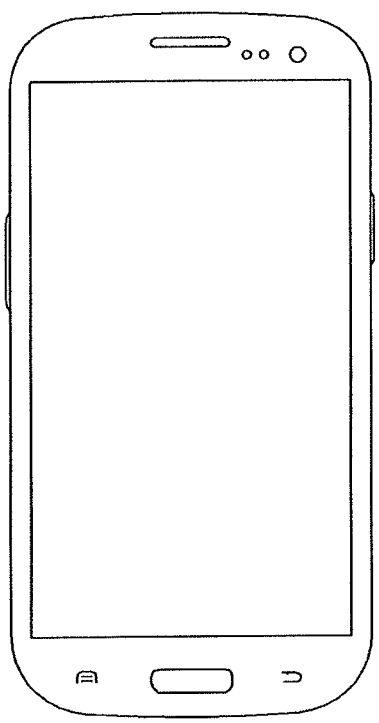

FIGS. 16 through 18 illustrate examples of a semiconductor system to which semiconductor devices according to example embodiments can be applied.

FIG. 16 illustrates a tablet personal computer (PC) 1200, FIG. 17 illustrates a notebook computer 1300, and FIG. 18 illustrates a smartphone 1400. At least one of the semiconductor devices according to the above-described example embodiments, as set forth herein, may be used in the tablet PC 1200, the notebook computer 1300, and the smartphone 1400.

Semiconductor devices according to example embodiments, as set forth herein, may also be applied to various IC devices other than those set forth herein. That is, while the tablet PC 1200, the notebook computer 1300, and the smartphone 1400 have been described above as examples of the semiconductor system according to the current embodiment, the examples of the semiconductor system according to the current embodiment are not limited to the tablet PC 1200, the notebook computer 1300, and the smartphone 1400.

In some example embodiments, the semiconductor system may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

While the present disclosure has been particularly shown and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A semiconductor device, comprising:
an active fin extending along a first direction and having a protruding shape;
a field insulating layer covering at least a part of the active fin;
a gate structure on the active fin to extend along a second direction intersecting the first direction; and
a first spacer on a first side of the gate structure,
wherein a first gate-part of the gate structure is adjacent to and physically contacted with a second gate-part of the gate structure in the second direction,
wherein a first spacer-part of the first spacer is adjacent to and physically contacted with a second spacer-part of the first spacer in the second direction,
wherein an entirety of the first gate-part and an entirety of the first spacer-part are only in a first area on the field insulating layer and do not extend to the active fin in the second direction, as viewed in a third direction intersecting the first direction and the second direction,
wherein an entirety of the second gate-part and an entirety of the second spacer-part are only in a second area on the active fin and do not extend to the field insulating layer in the second direction, the second area not overlapping the first area, as viewed in the third direction,
wherein a first width (W1) of the entirety of the first gate-part in the first direction is smaller than a second width (W2) of the entirety of the second gate-part in the first direction, and
wherein a third width (L1) of the entirety of the first spacer-part in the first direction is greater than a fourth width (L2) of the entirety of the second spacer-part in the first direction.

2. The semiconductor device of claim 1, wherein a sum of the second width (W2) and the fourth width (L2) is greater than a sum of the first width (W1) and the third width (L1).

3. The semiconductor device of claim 1, wherein the semiconductor device further comprises a second spacer on a second side of the gate structure, the second side of the gate structure being opposite the first side of the gate structure,
wherein a third spacer-part of the second spacer is adjacent to a fourth spacer-part of the second spacer in the second direction,
wherein an entirety of the third spacer-part is only on the field insulating layer and does not extend to the active fin in the second direction, as viewed in the third direction intersecting the first direction and the second direction,
wherein an entirety of the fourth spacer-part is only on the active fin and does not extend to the field insulating layer in the second direction, the second area being non-overlapping with the first area, as viewed in the third direction,
wherein a fifth width (L3) of the entirety of the third spacer-part in the first direction is greater than a sixth width (L4) of the entirety of the fourth spacer-part in the first direction.

4. The semiconductor device of claim 3, wherein a sum of the second width (W2) and the sixth width (L4) is greater than a sum of the first width (W1) and the fifth width (L3).

5. The semiconductor device of claim 3, wherein a sum of the second width (W2), the fourth width (L2), and the sixth width (L4) is equal to a sum of the first width (W1), the third width (L1), and the fifth width (L3).

6. The semiconductor device of claim 1, wherein the second gate-part and the second spacer-part have a same length as the active fin in the second direction.

7. The semiconductor device of claim 1, wherein the second gate-part and a top surface of the active fin completely overlap each other, and the first gate-part is not on the active fin.

8. A semiconductor device, comprising:
an active fin extending along a first direction and having a protruding shape;
a field insulating layer covering at least a part of the active fin;
a gate structure on the active fin to extend along a second direction intersecting the first direction;
a first spacer on a first side of the gate structure; and
a second spacer on a second side of the gate structure, the second side of the gate structure being opposite the first side of the gate structure,
wherein a first gate-part of the gate structure is adjacent to and physically contacted with a second gate-part of the gate structure in the second direction,
wherein a first spacer-part of the first spacer is adjacent to and physically contacted with a second spacer-part of the first spacer in the second direction,
wherein a third spacer-part of the second spacer is adjacent to a fourth spacer-part of the second spacer in the second direction,
wherein an entirety of the first gate-part, an entirety of the first spacer-part, and an entirety of the third spacer-part are only in a first area on the field insulating layer and do not extend to the active fin in the second direction, as viewed in a third direction intersecting the first direction and the second direction,
wherein an entirety of the second gate-part, an entirety of the second spacer-part, and an entirety of the fourth spacer-part are only in a second area on the active fin and do not extend to the field insulating layer in the second direction, the second area not overlapping the first area, as viewed in the third direction,
wherein a first width (W1) of the entirety of the first gate-part in the first direction is greater smaller than a second width (W2) of the entirety of the second gate-part in the first direction, and
wherein a third width (L1) of the entirety of the first spacer-part in the first direction is greater than a fourth width (L2) of the entirety of the second spacer-part in the first direction.

9. The semiconductor device of claim 8, wherein a sum of the second width (W2) and the fourth width (L2) is greater than a sum of the first width (W1) and the third width (L1).

10. The semiconductor device of claim 8, wherein a fifth width (L3) of the entirety of the first spacer-part in the first direction is greater than a sixth width (L4) of the entirety of the second spacer-part in the first direction.

11. The semiconductor device of claim 10, wherein a sum of the second width (W2) and the sixth width (L4) is greater than a sum of the first width (W1) and the fifth width (L3).

12. The semiconductor device of claim 10, wherein a sum of the second width (W2), the fourth width (L2), and the sixth width (L4) is equal to a sum of the first width (W1), the third width (L1), and the fifth width (L3).

13. The semiconductor device of claim 8, wherein the second gate-part, the second spacer-part, and the fourth spacer-part have a same length as the active fin in the second direction.

14. The semiconductor device of claim 8, wherein the second spacer-part and a top surface of the active fin completely overlap each other, and the first spacer-part is not on the active fin.

15. A semiconductor device, comprising:
   an active fin extending along a first direction and having a protruding shape;
   a field insulating layer covering at least a part of the active fin;
   a gate structure on the active fin to extend along a second direction intersecting the first direction;
   a first spacer on a first side of the gate structure; and
   a second spacer on a second side of the gate structure, the second side of the gate structure being opposite the first side of the gate structure,
   wherein a first spacer-part of the first spacer is adjacent to and physically contacted with a second spacer-part of the first spacer in the second direction,
   wherein a third spacer-part of the second spacer is adjacent to and physically contacted with a fourth spacer-part of the second spacer in the second direction,
   wherein an entirety of the first spacer-part and an entirety of the third spacer-part are only in a first area on the field insulating layer and do not extend to the active fin in the second direction, as viewed in a third direction intersecting the first direction and the second direction,
   wherein an entirety of the second spacer-part and an entirety of the fourth spacer-part are only in a second area on the active fin and do not extend to the field insulating layer in the second direction, the second area not overlapping the first area, as viewed in the third direction,
   wherein a first width (L1) of the entirety of the first spacer-part in the first direction is greater than a second width (L2) of the entirety of the second spacer-part in the first direction, and
   wherein a third width (L3) of the entirety of the third spacer-part in the first direction is greater than a fourth width (L4) of the entirety of the fourth spacer-part in the first direction.

16. The semiconductor device of claim 15,
   wherein a first gate-part of the gate structure is adjacent to a second gate-part of the gate structure in the second direction,
   wherein an entirety of the first gate-part is only on the field insulating layer and does not extend to the active fin in the second direction, as viewed in the third direction intersecting the first direction and the second direction,
   wherein an entirety of the second gate-part is only on the active fin and does not extend to the field insulating layer in the second direction, the second area being non-overlapping with the first area, as viewed in the third direction,
   wherein a fifth width (W1) of the entirety of the first gate-part in the first direction is greater than a sixth width (W2) of the entirety of the second gate-part in the first direction.

17. The semiconductor device of claim 16, wherein a sum of the second width (L2) and the sixth width (W2) is greater than a sum of the first width (L1) and the fifth width (W1).

18. The semiconductor device of claim 16, wherein a sum of the fourth width (L4) and the sixth width (W2) is greater than a sum of the third width (L3) and the fifth width (W1).

19. The semiconductor device of claim 16, wherein a sum of the second width (L2), the fourth width (L4), and the sixth width (W2) is equal to a sum of the first width (L1), the third width (L3), and the fifth width (W1).

20. The semiconductor device of claim 15, wherein the second spacer-part and the fourth spacer-part have a same length as the active fin in the second direction.

* * * * *